(12) United States Patent
Jang et al.

(10) Patent No.: US 8,343,879 B2
(45) Date of Patent: Jan. 1, 2013

(54) METHOD FOR FORMING ISOLATION LAYER OF SEMICONDUCTOR DEVICE

(75) Inventors: Se-Aug Jang, Gyeonggi-do (KR); Eun-Jeong Kim, Gyeonggi-do (KR); Eun-Ha Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 97 days.

(21) Appl. No.: 12/825,592

(22) Filed: Jun. 29, 2010

(65) Prior Publication Data
US 2011/0237047 A1    Sep. 29, 2011

(30) Foreign Application Priority Data
Mar. 29, 2010   (KR) .................. 10-2010-0028097

(51) Int. Cl.
*H01L 21/31*    (2006.01)
(52) U.S. Cl. ........................... 438/770; 438/430
(58) Field of Classification Search .............. 438/770, 438/430
See application file for complete search history.

(56) References Cited

U.S. PATENT DOCUMENTS

| 4,689,113 | A   | * | 8/1987 | Balasubramanyam et al. | 438/631 |
| 6,767,843 | B2  | * | 7/2004 | Lipkin et al. | 438/758 |
| 6,930,062 | B2  | * | 8/2005 | Hyun et al. | 438/790 |
| 2002/0009899 | A1 | * | 1/2002 | Shiramizu | 438/770 |

FOREIGN PATENT DOCUMENTS

| KR | 1020070002396 | 1/2007 |
| KR | 1020090075954 | 7/2009 |
| KR | 1020090113678 | 11/2009 |
| KR | 1020100005609 | 1/2010 |

OTHER PUBLICATIONS

Notice of Allowance issued by the Korean Intellectual Property Office on Jun. 5, 2012.

\* cited by examiner

*Primary Examiner* — Julio J Maldonado
*Assistant Examiner* — Robert Bachner
(74) *Attorney, Agent, or Firm* — IP & T Group LLP

(57) ABSTRACT

A method for fabricating a semiconductor device includes forming an isolation layer which defines an active region in a substrate, forming recess patterns in the active region and the isolation layer, baking a surface of the recess pattern by conducting an annealing process and forming a gate dielectric layer over a surface of the recess pattern by conducting an oxidation process.

22 Claims, 20 Drawing Sheets

(PRIOR ART-1 ATM DRY OXIDATION)

(PRIOR ART-1 ATM DRY OXIDATION)

(PRIOR ART-LOW PRESSURE RADICAL OXIDATION)

(PRIOR ART-LOW PRESSURE RADICAL OXIDATION)

(PRESENT INVENTION-SECOND EMBODIMENT)

(PRESENT INVENTION-SECOND EMBODIMENT)

(PRIOR ART-1 ATM DRY OXIDATION)

(PRIOR ART-LOW PRESSURE RADICAL OXIDATION)

(PRESENT INVENTION-FIRST EMBODIMENT)

(PRESENT INVENTION-SECOND EMBODIMENT)

(PRESENT INVENTION-THIRD EMBODIMENT)

METHOD FOR FORMING ISOLATION LAYER OF SEMICONDUCTOR DEVICE

CROSS-REFERENCE TO RELATED APPLICATIONS

The present application claims priority of Korean Patent Application No. 10-2010-0028097, filed on Mar. 29, 2010, which is incorporated herein by reference in its entirety.

BACKGROUND OF THE INVENTION

Exemplary embodiments of the present invention relate to a semiconductor device fabricating technology, and more particularly, to a method for fabricating a semiconductor device with a buried gate (BG).

Recently, research has actively been conducted for a buried gate (BG) in which a gate electrode is buried in a substrate in a semiconductor memory device, such as a DRAM, so that parasitic capacitance between a word line and a bit line can be significantly reduced. Such a buried gate is advantageous in that it can considerably increase the sensing margin of the semiconductor memory device.

FIGS. 1A to 1D are cross-sectional views illustrating the processes of a conventional method for fabricating a semiconductor device with a buried gate, and FIG. 2 is a graph showing breakdown voltage (BV) properties depending upon ways of forming a gate dielectric layer in the conventional method for fabricating a semiconductor device with a buried gate.

Referring to FIG. 1A, an active region 14 may be defined by forming an isolation layer 13 in a substrate 11, for example, a silicon substrate, through an STI (shallow trench isolation) process. The isolation layer 13 may be formed through a series of processes of forming a trench 12 for isolation through selectively etching the substrate 11, filling the trench 12 with a spin-on dielectric (SOD) layer, and annealing the filled spin-on dielectric layer.

The isolation layer 13 may be divided, depending upon a depth from the upper surface of the substrate 11, into an upper zone 13A which is well baked by the annealing process and a lower zone 13B which is less baked by the annealing process.

Referring to FIG. 1B, by selectively etching the substrate 11, recess patterns 15 may be formed in such a way as to extend simultaneously across the isolation layer 13 and the active regions 14. Hereafter, for the sake of convenience in explanation, the recess pattern 15 which is formed in the isolation layer 13 will be referred to as a first recess pattern 15A, and the recess pattern 15 which is formed in the active region 14 will be referred to as a second recess pattern 15B.

Referring to FIG. 1C, a gate dielectric layer 16 may be formed on the surface of the recess pattern 15 by conducting an oxidation process. At this time, due to the characteristics of the oxidation process, the gate dielectric layer 16 may not be formed on the surface of the first recess pattern 15A and may be formed only on the surface of the second recess pattern 15B. For reference, although the gate dielectric layer 16 may be formed also on the surface of the substrate 11 in the active region 14, illustration thereof will be omitted herein for the sake of convenience in explanation.

Referring to FIG. 1D, a buried gate may be formed through a series of processes of filling gate electrodes 17 partially in the recess patterns 15 and filling the remaining portions of the recess patterns 15 with a sealing layer 18.

In the conventional art, the gate dielectric layer 16 may be formed through 1 atm dry oxidation or low pressure radical oxidation which is implemented at a pressure lower than 1 atm. For reference, the 1 atm dry oxidation may represent an oxidation method which uses oxygen ($O_2$) gas under 1 atm or the atmospheric pressure, and the low pressure radical oxidation may represent an oxidation method which uses oxygen radicals and hydrogen radicals produced under a low pressure less than several torrs using oxygen ($O_2$) gas and hydrogen ($H_2$) gas. The radicals may be produced at a low pressure less than 1 atm. In general, the low pressure radical oxidation has good oxidation capability, and it is known that generally the low pressure radical oxidation produces an oxide layer that is superior in quality to that of the 1 atm dry oxidation.

Referring to FIG. 2, in the case of forming the gate dielectric layer 16 through low pressure radical oxidation, it can be seen that electrical characteristics, in particular, breakdown voltage properties are superior to the case of the 1 atm dry oxidation. Accordingly, the gate dielectric layer 16 may be formed through the low pressure radical oxidation in consideration of quality.

However, when the gate dielectric layer 16 is formed through the low pressure radical oxidation by the conventional processes for forming the buried gate, the substrate may be warped more than in the case where the gate dielectric layer 16 is formed through the 1 atm dry oxidation. Furthermore, as the substrate 11 is warped, in overlay characteristics may be degraded in a photolithography process.

The reason why the substrate 11 is warped more when the gate dielectric layer 16 is formed through the low pressure radical oxidation may be explained as described below.

Referring to FIG. 1C, when conducting the process for forming the gate dielectric layer 16, outgassing of the impurities contained in the isolation layer 13, which includes the spin-on dielectric layer, may occur in the lower zone 13B of the isolation layer 13 which may be relatively less baked compared to the upper zone 13A of the isolation layer 13. In the case where the gate dielectric layer 16 is formed through the low pressure radical oxidation which is implemented at a pressure lower than the 1 atm dry oxidation, the outgassing of the impurities contained in the isolation layer 13 may occur to a greater extent. The outgassing of the impurities contained in the isolation layer 13 may cause volume shrinkage of the isolation layer 13. As the volume of the isolation layer 13 shrinks, a tensile stress in the isolation layer 13 may increase, and the substrate 11 may be warped (see FIGS. 9A and 9B, FIGS. 10A and 10B, and FIGS. 14A and 14B).

SUMMARY OF THE INVENTION

An exemplary embodiment of the present invention is directed to a method for fabricating a semiconductor device, which can secure the quality and electrical characteristics of a gate dielectric layer, reduce the warpage of a substrate, and secure overlay characteristics.

In accordance with an exemplary embodiment of the present invention, a method for fabricating a semiconductor device includes forming an isolation layer which defines an active region, in a substrate, forming recess patterns in the active region and the isolation layer, baking a surface of the recess pattern by conducting an annealing process, and forming a gate dielectric layer over a surface of the recess pattern, by conducting an oxidation process.

In accordance with another exemplary embodiment of the present invention, a method for fabricating a semiconductor device includes forming an isolation layer which defines an active region in a substrate, forming recess patterns in the active region and the isolation layer, performing a first oxidation process to bake a surface of the recess pattern and to form a first dielectric layer over a surface of the recess pattern in the active region, and performing a second oxidation process to form a second dielectric layer over the first dielectric layer.

DESCRIPTION OF SPECIFIC EMBODIMENTS

Figure 1A:
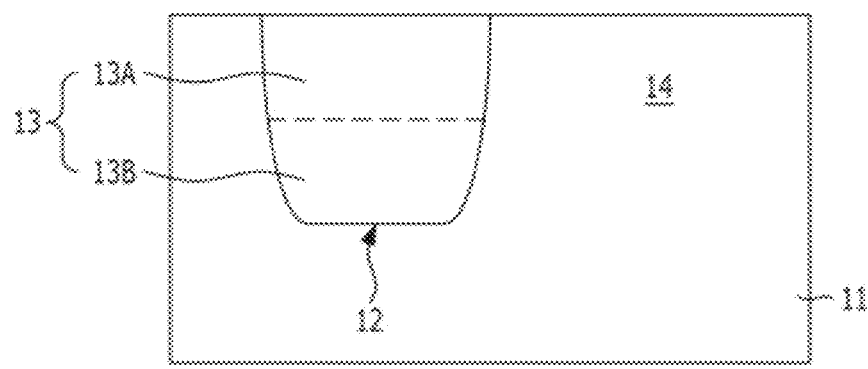
FIGS. 1A to 1D are cross-sectional views illustrating the processes of a conventional method for fabricating a semiconductor device with a buried gate.
Figure 1B:
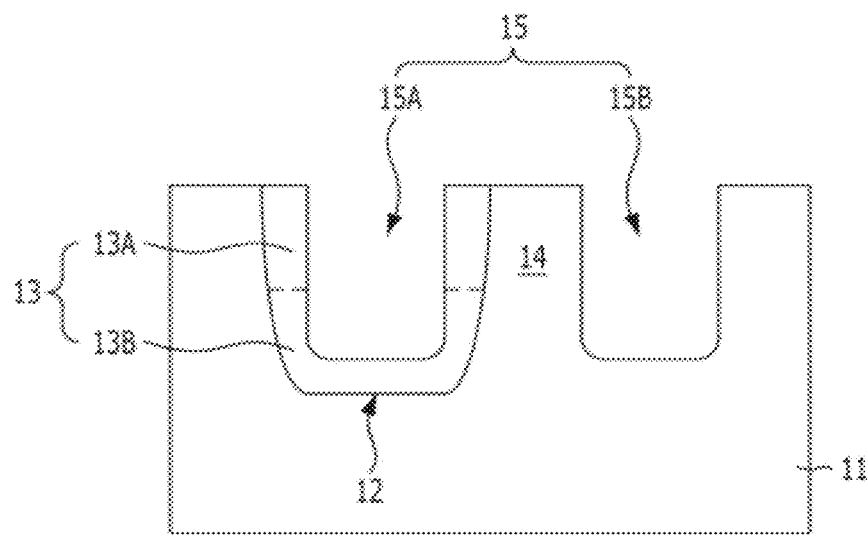
Figure 1C:
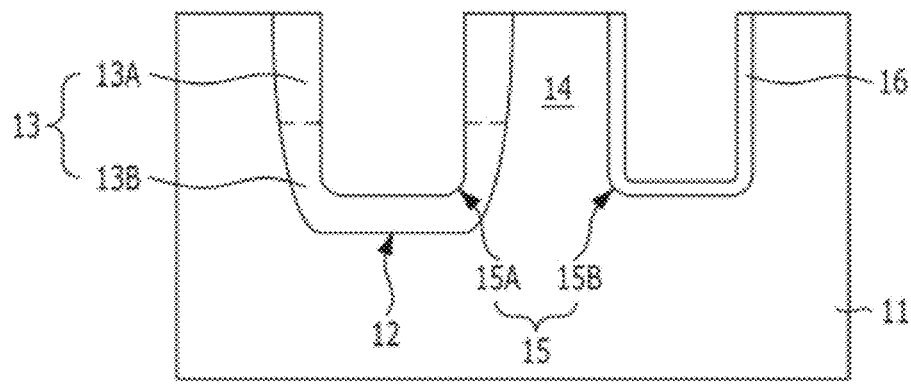
Figure 1D:
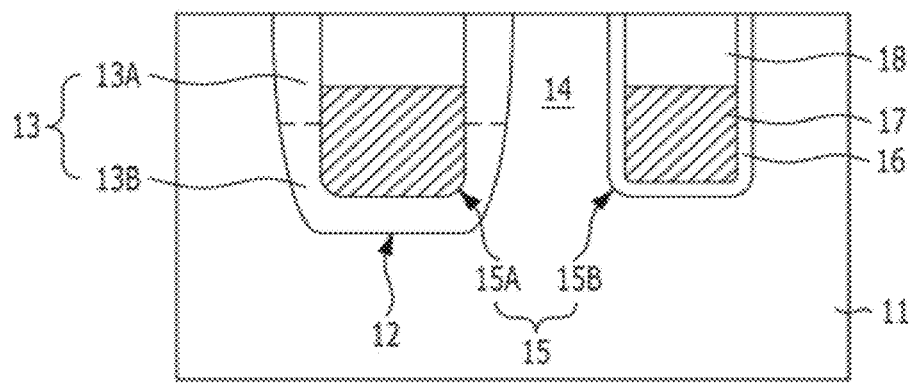
Figure 2:
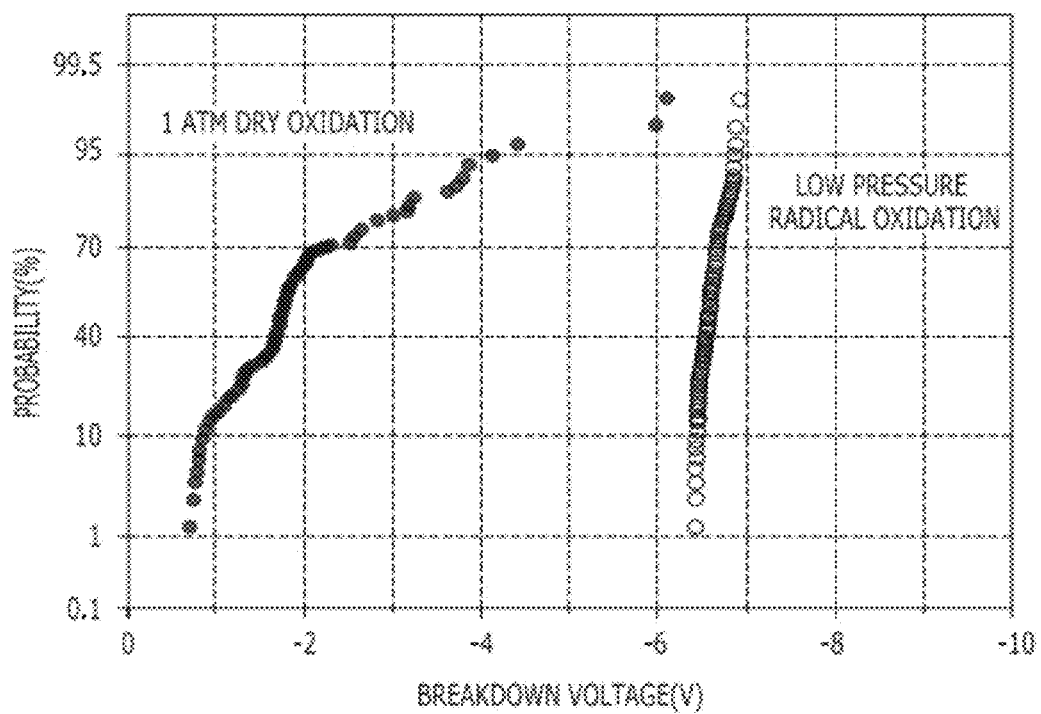
FIG. 2 is a graph showing breakdown voltage (BV) properties depending upon ways of forming a gate dielectric layer in the conventional method for fabricating a semiconductor device with a buried gate.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

Embodiments of the present invention, which will be described below, provide methods for fabricating a semiconductor device, which can secure the quality and electrical characteristics of a gate dielectric layer, reduce the warpage of a substrate, and secure overlay characteristics in a semiconductor device with a buried gate (BG). In detail, in the exemplary embodiments of the present invention, the gate dielectric layer may be formed through low pressure radical oxidation in order to secure the quality and electrical characteristics, in particular, a breakdown voltage (BV), of the gate dielectric layer. In order to reduce outgassing of the impurities contained in an isolation layer due to the fact that the gate dielectric layer is formed through the low pressure radical oxidation, the exposed surface of the isolation layer may be baked before forming the gate dielectric layer or while forming the gate dielectric layer. In this way, the outgassing of the impurities during additional processes can be reduced.

Figure 3A:
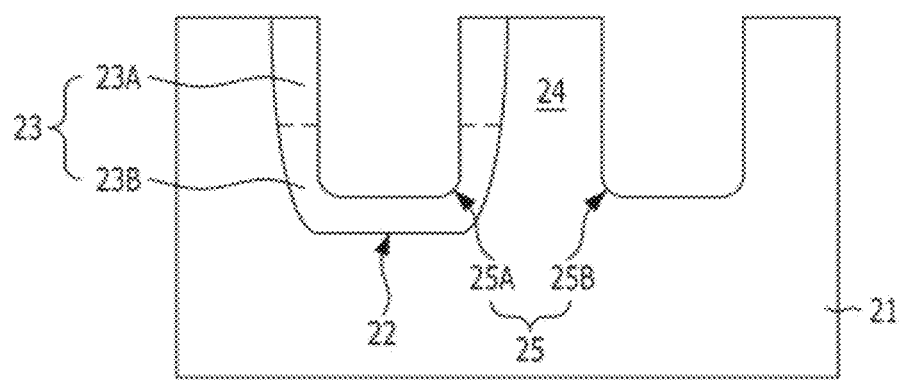
FIGS. 3A to 3D are cross-sectional views illustrating the processes of a method for fabricating a semiconductor device in accordance with an exemplary embodiment of the present invention.
Figure 3B:
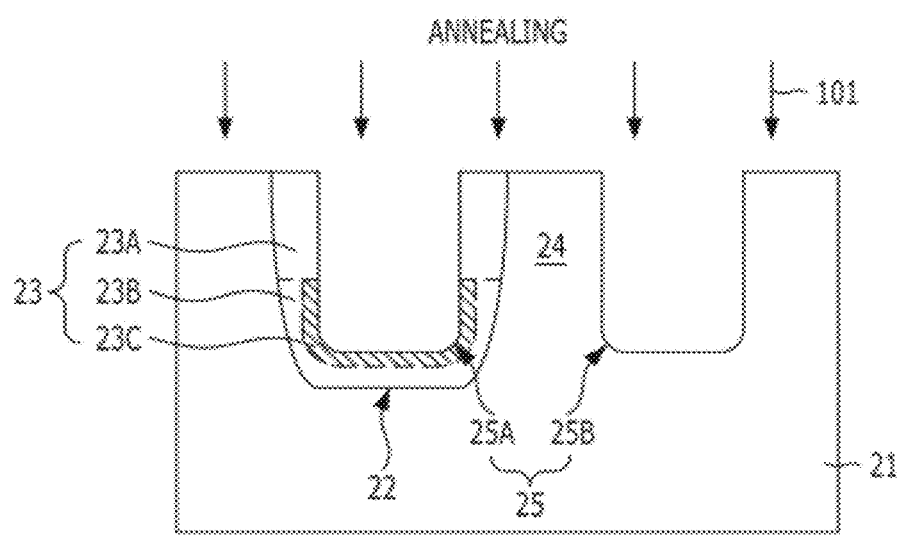
Figure 3C:
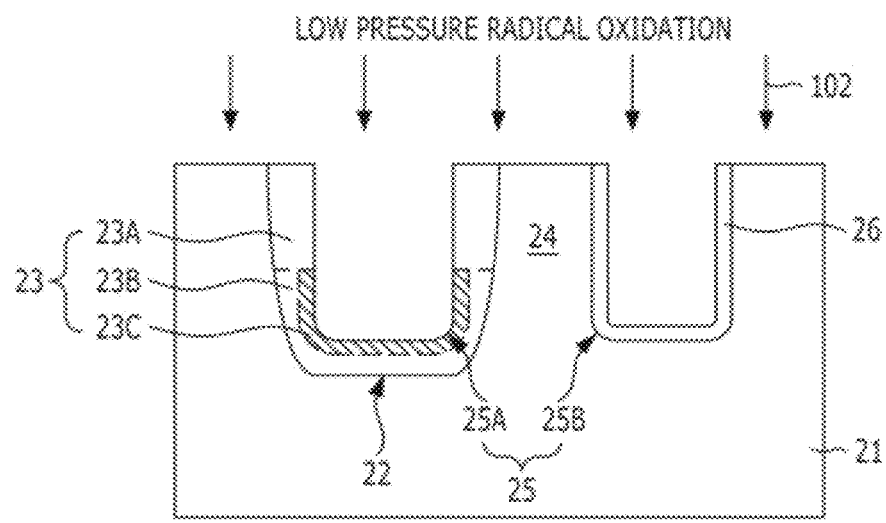
Figure 3D:
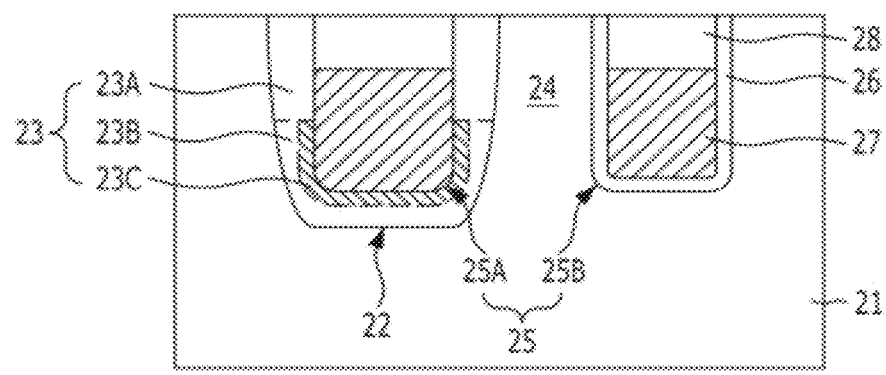
Figure 4:
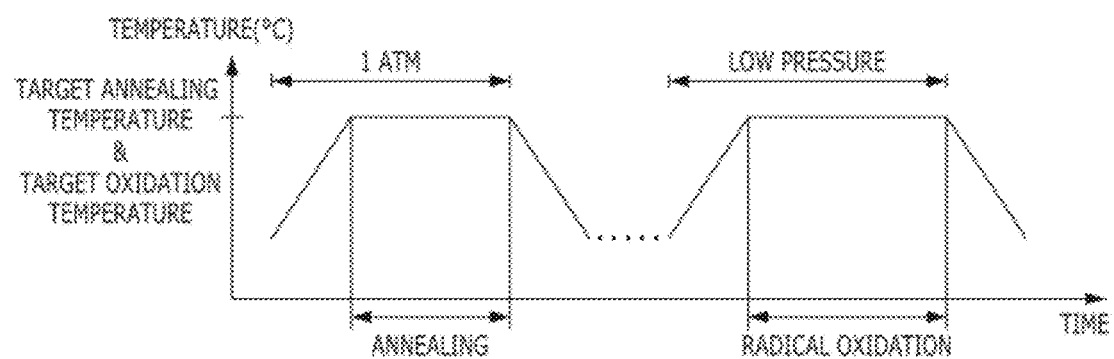
FIG. 4 is a graph showing changes in temperature and pressure over time during processes in the method for fabricating a semiconductor device in accordance with an exemplary embodiment of the present invention.

FIGS. 3A to 3D are cross-sectional views illustrating the processes of a method for fabricating a semiconductor device in accordance with an exemplary embodiment of the present invention, and FIG. 4 is a graph showing changes in temperature and pressure over time during processes in the method for fabricating a semiconductor device in accordance with an exemplary embodiment of the present invention.

Referring to FIG. 3A, a plurality of active regions 24 may be defined by forming an isolation layer 23 in a substrate 21, for example, a silicon substrate. The isolation layer may be formed through, for example, an STI (shallow trench isolation) process.

The isolation layer 23 may be formed through a series of processes, including forming a trench 22 through selectively etching the substrate 21, filling the trench 22 with an insulation material, and annealing and baking the filled insulation material. Further, a spin-on dielectric (SOD) layer having good gap-fill characteristics may be used for the insulation material. Here, for example, the spin-on dielectric layer may be based on polysilazane.

The isolation layer 23 composed of the spin-on dielectric Layer may be baked differently depending on a depth. That is to say, a lower zone 23B of the isolation layer 23 may be less baked than an upper zone 23A of the isolation layer 23.

By selectively etching the substrate 21, recess patterns 25 in which buried gates are to be formed may be defined. Hereafter, for the sake of convenience in explanation, the recess pattern 25 which is formed in the isolation layer 23 will be referred to as a first recess pattern 25A, and the recess pattern 25 which is formed in the active region 24 will be referred to as a second recess pattern 25B.

The first and second recess patterns 25A and 25B may have the same depth, and both the upper zone 23A and the lower zone 23B of the isolation layer 23 may be exposed by forming of the first recess pattern 25A.

Referring to FIGS. 3B and 4, in order to reduce outgassing of impurities, during a subsequent process for forming a gate dielectric layer, from the lower zone 23B of the isolation layer 23 which is exposed due to forming of the first recess pattern 25A, an annealing process 101 may be conducted. By conducting the annealing process 101, the surface of the first recess pattern 25A may be baked in the lower zone 23B of the isolation layer 23, and a baked zone 23C for reducing the outgassing of the impurities may be formed.

The baked zone 23C may be formed through a series of processes, including Loading the substrate 21 formed with the recess patterns 25 into a chamber for the annealing process 101, raising a temperature to a target annealing temperature in a nitrogen (N) atmosphere under 1 atm (or the atmospheric pressure), and annealing the substrate 21 for approximately 5 to approximately 30 minutes in the nitrogen atmosphere under 1 atm after the target annealing temperature is reached. The target annealing temperature may be in the range from approximately 750° C. to approximately 950° C.

The baked zone 23C may be formed by the thermal energy applied during the annealing process 101. The reason for conducting the annealing process 101 under 1 atm is to reduce the occurrence of outgassing from the isolation layer 23 during the annealing process. A temperature raising speed to the target annealing temperature in the annealing process 101 may be approximately 3° C./min to approximately 10° C./min. If a temperature raising speed is less than approximately 3° C./min, a time required to raise a temperature to the target annealing temperature may increase, and the productivity of the semiconductor device may be deteriorate. If the temperature raising speed is greater than approximately 10° C./min, the outgassing of the impurities may occur from the isolation layer 23 due to an abrupt temperature rise, or the substrate 21 may be warped. Also, a temperature raising speed greater than approximately 10° C./min, may be cause the baked zone 23C to be formed to a non-uniform depth (or thickness) from the surface of the first recess pattern 25A. If the baked zone 23C is formed to a non-uniform depth (or thickness) from the surface of the first recess pattern 25A, it may be difficult to stably suppress the outgassing of the impurities from the isolation layer 23 during the subsequent process for forming the gate dielectric layer.

Further, the annealing process 101 may be conducted under an inert gas atmosphere, such as an argon (Ar) atmosphere, instead of the nitrogen atmosphere. The annealing process 101 may be conducted in a furnace.

Referring to FIGS. 3C and 4, a gate dielectric layer 26 may be formed on the surface of the recess pattern 25 by conducting low pressure radical oxidation 102. At this time, due to the characteristics of the low pressure radical oxidation 102, the gate dielectric layer 26 may not be formed on the surface of the first recess pattern 25A, but may be formed, for example, only on the surface of the second recess pattern 25B. Although the gate dielectric layer 26 may also be formed on the surface of the substrate 21 in the active region 24 by the low pressure radical oxidation 102, illustration thereof will be omitted herein for the sake of convenience in explanation.

The low pressure radical oxidation 102 may represent an oxidation method through which the gate dielectric layer 26 is formed by oxidating the substrate 21 using the oxygen radicals and hydrogen radicals produced from oxygen ($O_2$) gas and hydrogen ($H_2$) gas under a low pressure. For example, the low pressure may be a pressure lower than 1 atm.

In detail, the gate dielectric layer 26 may be formed by loading the substrate 21, having the baked zone 23C, into a chamber, raising a temperature to a target oxidation temperature with a speed of approximately 3° C./min to approximately 10° C./min in a nitrogen atmosphere under a low pressure, and conducting the low pressure radical oxidation 102 under the low pressure after the temperature reaches the target oxidation temperature. The target oxidation in temperature may have the same range as the target annealing temperature for forming the baked zone 23C. For example, the low pressure radical oxidation 102 for forming the gate dielectric layer 26 may be conducted under a pressure ranging from approximately 0.1 torr to approximately 5.0 torr at a temperature ranging from approximately 750° C. to approximately 950° C., by using a mixed gas in which the oxygen ($O_2$) gas and the hydrogen ($H_2$) gas are mixed.

Here, the raising of a temperature to the target oxidation temperature may be implemented under 1 atm. The reason why the temperature raising speed to the target oxidation temperature ranges from approximately 3° C./min to approximately 10° C./min is to reduce a probability of the deterioration of productivity and the occurrence of side effects such as the warpage of the substrate 21 due to an abrupt temperature rise, as mentioned above.

Referring to FIG. 3D, gate electrodes 27 may be formed in such a way as to partially fill the recess patterns 25, and a sealing layer 28 may be formed to fill the remaining portions of the recess patterns 25.

In this exemplary embodiment of the present invention constructed as mentioned above, even when the gate dielectric layer 26 is formed through low pressure radical oxidation 102, the occurrence of the outgassing of the impurities from the lower zone 23B of the isolation layer 23 during the process for forming the gate dielectric layer 26 may be reduced due to the presence of the baked zone 23C. Therefore, the quality and the electrical characteristics of the gate dielectric layer 26 may be secured, the warpage of the substrate 21 may be reduced, and the overlay characteristics may not be degraded in a photolithography process (see FIGS. 11A, 11B and 14C).

Another exemplary embodiment of the present invention, which will be described below, provides a method for fabricating a semiconductor device, which may reduce the warpage of a substrate and improve overlay characteristics while forming a gate dielectric layer through low pressure radical oxidation.

Figure 5A:
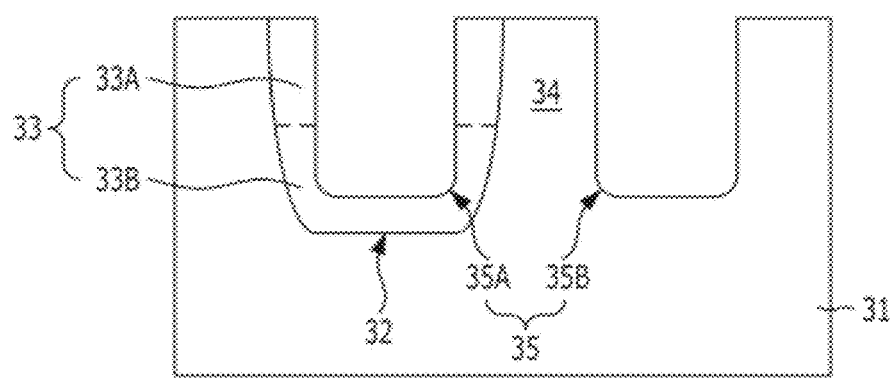
FIGS. 5A to 5D are cross-sectional views illustrating the processes of a method for fabricating a semiconductor device in accordance with another exemplary embodiment of the present invention.
Figure 5B:
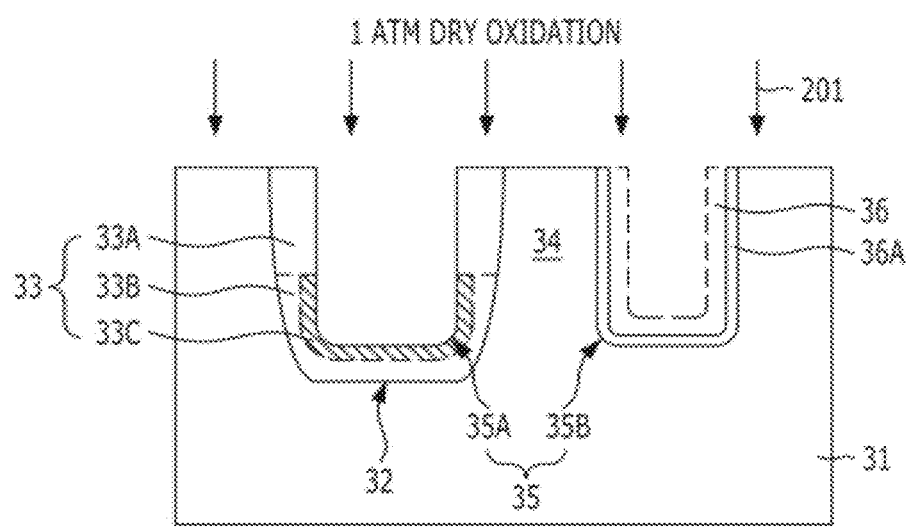
Figure 5C:
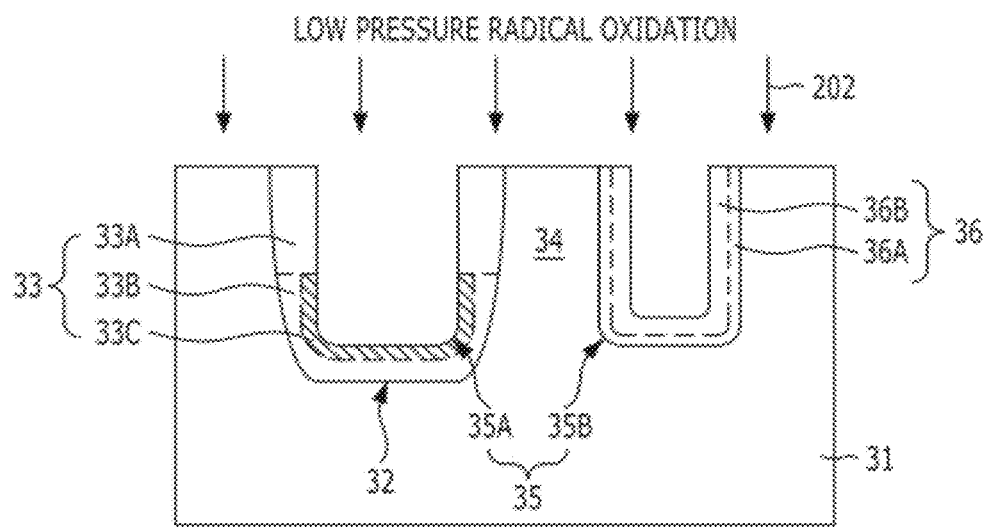
Figure 5D:
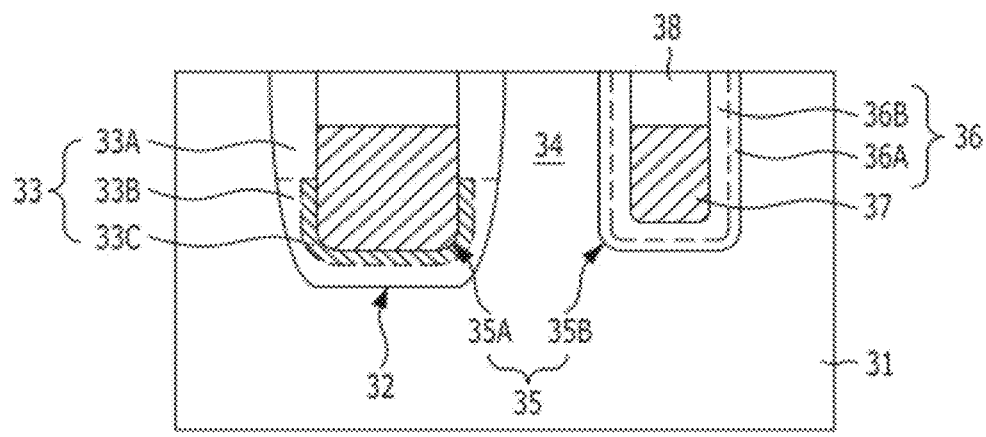
Figure 6:
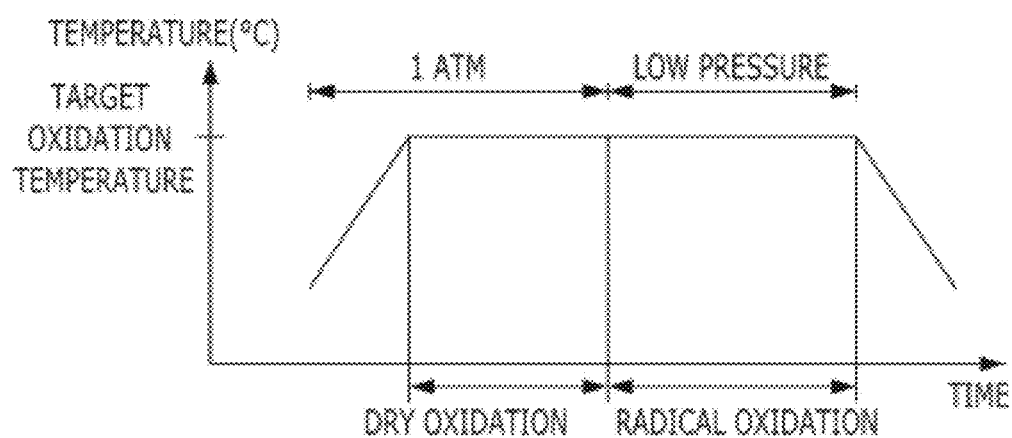
FIG. 6 is a graph showing changes in temperature and pressure over time during processes in the method for fabricating a semiconductor device in accordance with another exemplary embodiment of the present invention.

FIGS. 5A to 5D are cross-sectional views illustrating the processes of a method for fabricating a semiconductor device in accordance with another exemplary embodiment of the present invention, and FIG. 6 is a graph showing changes in temperature and pressure over time during processes in the method for fabricating a semiconductor device in accordance with this exemplary embodiment of the present invention.

Referring to FIG. 5A, a plurality of active regions 34 may be defined by forming an isolation layer 33 in a substrate 31, for example, a silicon substrate. The isolation layer 33 may be formed through, for example, an STI (shallow trench isolation) process. The isolation layer 33 may be formed through a series of processes, including forming a trench 32 through selectively etching the substrate 31, filling the trench 32 with an insulation material, and annealing/baking the filled insulation material. Further, a spin-on dielectric (SOD) layer having good gap-fill characteristics may be used for the insulation material. For example, the spin-on dielectric layer may be based on polysilazane.

The isolation layer 33 composed of the spin-on dielectric layer may be baked differently depending on a depth. That is to say, a lower zone 33B of the isolation layer 33 may be less baked than an upper zone 33A of the isolation layer 33.

By selectively etching the substrate 31, recess patterns 35 in which buried gates are to be formed may be defined. Hereafter, for the sake of convenience in explanation, the recess pattern 35 which is formed in the isolation layer 33 will be referred to as a first recess pattern 35A, and the recess pattern 35 which is formed in the active region 34 will be referred to as a second recess pattern 35B.

The first and second recess patterns 35A and 35B may have the same depth, and both the upper zone 33A and the lower zone 33S of the isolation layer 33 may be exposed by forming of the first recess pattern 35A.

Referring to FIGS. 5B and 6, by conducting 1 atm dry oxidation 201, a first gate dielectric layer 36A may be formed on the surface of the second recess pattern 35B, and the surface of the first recess pattern 35A may be baked in the lower zone 33B of the isolation layer 33, and consequently a baked zone 33C may be formed. The baked zone 33C may function to reduce outgassing of impurities during a subsequent process for forming a second gate dielectric layer by low pressure radical oxidation. Due to the characteristics of the 1 atm dry oxidation 201, the first gate dielectric layer 36A may not be formed on the surface of the first recess pattern 35A, but may be formed, for example, only on the surface of the second recess pattern 35B. Although the first gate dielectric layer 36A may be formed also on the surface of the substrate 31 in the active region 34 by the 1 atm dry oxidation 201, illustration thereof will be omitted herein for the sake of convenience in explanation.

The first gate dielectric layer 36A formed on the surface of the second recess pattern 35B through the 1 atm dry oxidation 201 may have a thickness ranging from approximately 10% to approximately 20% of the thickness of an entire gate dielectric layer 36 that is required by the semiconductor device. For reference, since the baked zone 33C may be formed in the isolation layer 33 during the 1 atm dry oxidation 201, if the thickness of the first gate dielectric layer 36A formed through the 1 atm dry oxidation 201 is less than approximately 10% of the thickness of the entire gate dielectric layer 36, the baked zone 33C may not be formed to a degree capable of reducing the outgassing of the impurities. Moreover, if the thickness of the first gate dielectric layer 36A formed through the 1 atm dry oxidation 201 exceeds approximately 20% of the thickness of the entire gate dielectric layer 36, the quality and electrical characteristics of the entire gate dielectric layer 36 may be degraded.

In the 1 atm dry oxidation 201 the baked zone 33C may be formed on the surface of the first recess pattern 35A in the lower zone 33B of the isolation layer 33, and, at the same time, the first gate dielectric layer 36A may be formed, the substrate 31, having the recess patterns 35, may be loaded into a chamber for the 1 atm dry oxidation 201, and a temperature may be raised to a target oxidation temperature with approximately 3° C./min to approximately 10° C./min in a nitrogen atmosphere under 1 atm (or the atmospheric pressure). If the temperature reaches the target oxidation temperature, the supply of nitrogen gas (N) may be interrupted with the pressure of 1 atm maintained, and oxygen gas ($O_2$) may be introduced into the chamber. In this state, the 1 atm dry oxidation 201 may be conducted in an oxygen atmosphere until the first gate dielectric layer 36A is grown to a thickness ranging from approximately 10% to approximately 20% of the thickness of the entire gate dielectric layer 36. At the same time when the first gate dielectric layer 36A is grown, the baked zone 33C is formed in the isolation layer 33, and the target oxidation temperature may be in the range from approximately 750° C. to approximately 950° C.

The baked zone 33C may be formed by the thermal energy applied during the 1 atm dry oxidation 201. The reason for forming the baked zone 33C under 1 atm is to reduce the occurrence of the outgassing of the impurities from the isolation layer 33. Since the reason why the temperature raising speed to the target oxidation temperature ranges from approximately 3° C./min to approximately 10° C./min is described in detail in the previous exemplary embodiment of the present invention, detailed description thereof will be omitted herein.

Referring to FIGS. 5C and 6, in order to form the gate dielectric layer 36 having electrical characteristics and a thickness which are required by the semiconductor device, low pressure radical oxidation 202 may be conducted. The first gate dielectric layer 36A formed through the 1 atm dry oxidation 201 and a second gate dielectric layer 36B formed through the low pressure radical oxidation 202 serve as the gate dielectric layer 36 of the semiconductor device. Due to the characteristics of the low pressure radical oxidation 202, the second gate dielectric layer 36B may not be formed on the surface of the first recess pattern 35A and may be formed, for example, only over the surface of the second recess pattern 35B. Although the second gate dielectric layer 36B may be formed also on the surface of the substrate 31 in the active region 34 by the low pressure radical oxidation 202, illustration thereof will be omitted herein for the sake of convenience in explanation.

In order to simplify the fabrication processes of the semiconductor device and improve the productivity, the low pressure radical oxidation 202 may be conducted in situ in the same chamber as in the 1 atm dry oxidation.

In detail, in a state in which the first gate dielectric layer 36A is formed through the 1 atm dry oxidation 201 to have a thickness ranging from approximately 10% to approximately 20% of the thickness of the entire gate dielectric layer 36, the second gate dielectric layer 36B may be formed through conducting the low pressure radical oxidation 202. The low pressure radical oxidation 202 may be conducted under a low pressure lower than 1 atm (or the atmospheric pressure) in the same temperature range as in the 1 atm dry oxidation 201, using a mixed gas in which the oxygen gas and the hydrogen gas are mixed. For example, the low pressure lower than 1 atm may have a range from approximately 0.1 torr to approximately 5.0 torr. The low pressure radical oxidation 202 may be conducted at a temperature ranging from approximately 750° C. to approximately 950° C.

Referring to FIG. 5D, gate electrodes 37 may be formed in such a way as to partially fill the recess patterns 35, and a sealing layer 38 may be formed to fill the remaining portions of the recess patterns 35. Consequently, buried gates may be formed.

In this exemplary embodiment of the present invention constructed as mentioned above, due to the fact that the first gate dielectric layer 36A may be formed through the 1 atm dry oxidation 201 and at the same time the baked zone 33C may be formed in the lower zone 33B of the isolation layer 33 exposed due to forming of the first recess pattern 35A, even when the second gate dielectric layer 36B is formed through the low pressure radical oxidation 202, the occurrence of the outgassing of the impurities from the lower zone 33B of the isolation layer 33 during the process for forming the second gate dielectric layer 36B may be reduced. Through this, the warpage of the substrate 31 may be reduced in the low pressure radical oxidation 202, and overlay characteristics may not be degraded in a photolithography process (see FIGS. 12A, 12B, and 14D).

Yet another exemplary embodiment of the present invention, which will be described below, provides a method for fabricating a semiconductor device, which can reduce the warpage of a substrate, improve overlay characteristics, and simplify a processing procedure while forming a gate dielectric layer through low pressure radical oxidation.

Figure 7A:
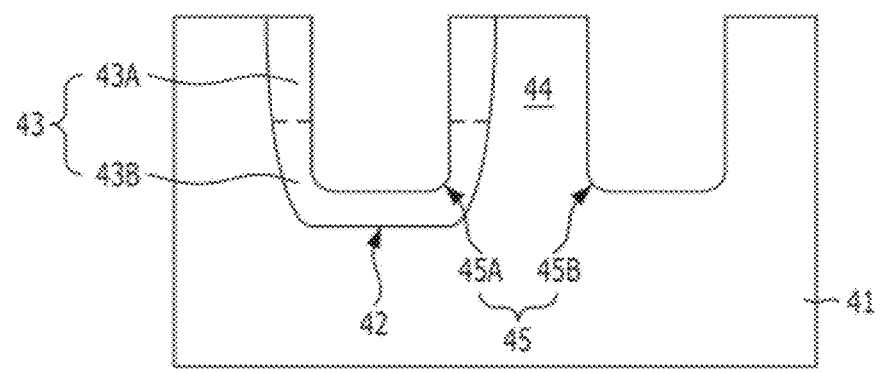
FIGS. 7A to 7D are cross-sectional views illustrating the processes of a method for fabricating a semiconductor device in accordance with yet another exemplary embodiment of the present invention.
Figure 7B:
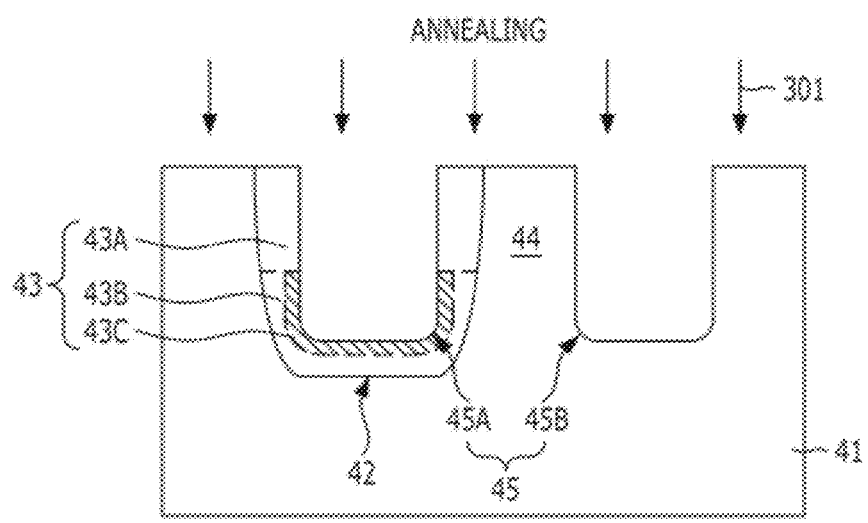
Figure 7C:
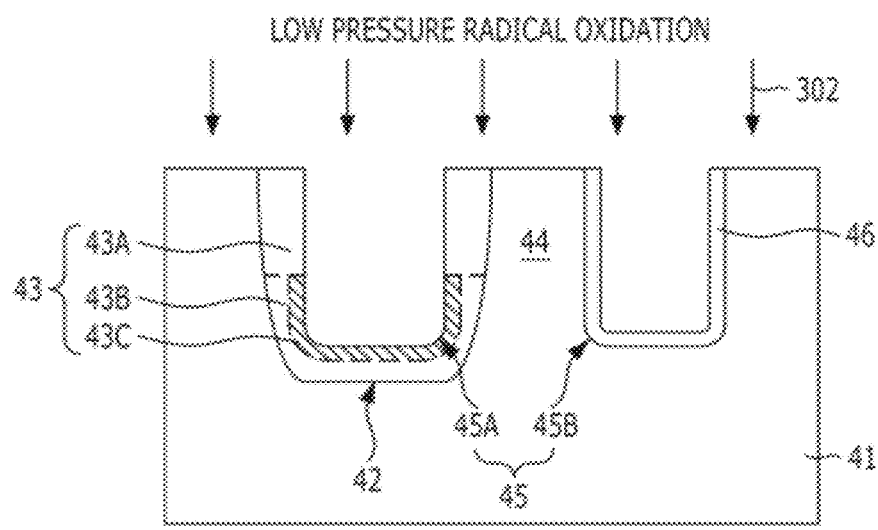
Figure 7D:
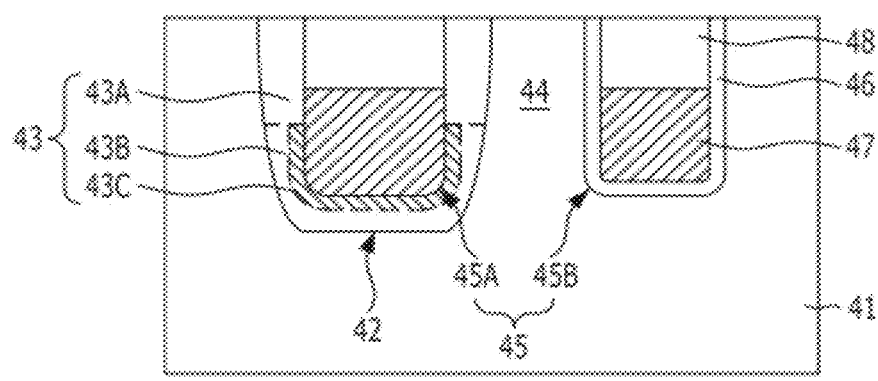
Figure 8:
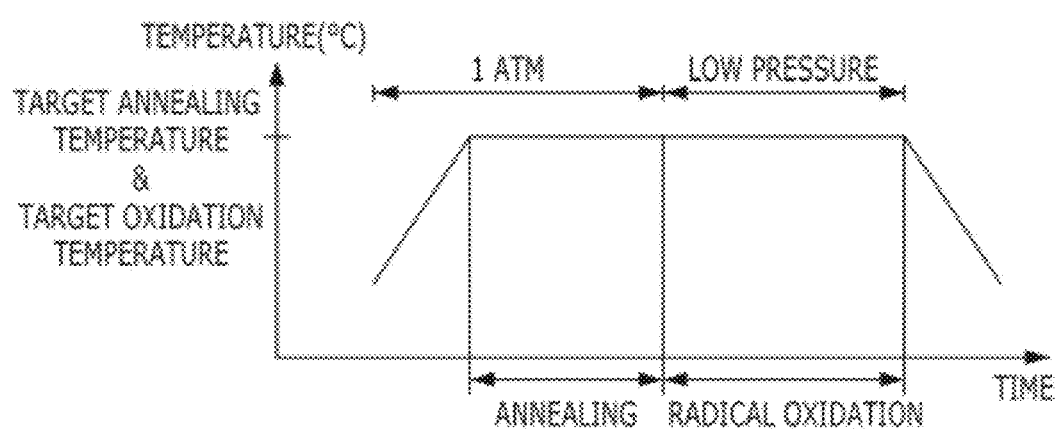
FIG. 8 is a graph showing changes in temperature and pressure over time during processes in the method for fabricating a semiconductor device in accordance with yet another exemplary embodiment of the present invention.

FIGS. 7A to 7D are cross-sectional views illustrating the processes of a method for fabricating a semiconductor device in accordance with yet another exemplary embodiment of the present invention, and FIG. 8 is a graph showing changes in temperature and pressure over time during processes in the method for fabricating a semiconductor device in accordance with this exemplary embodiment of the present invention.

Referring to FIG. 7A, a plurality of active regions 44 may be defined by forming an isolation layer 43 in a substrate 41, for example, a silicon substrate. The isolation layer 43 may be formed through, for example, an STI (shallow trench isolation) process. The isolation layer 43 may be formed through a series of processes, including forming a trench 42 through selectively etching the substrate 41, filling the trench 42 with an insulation material, and annealing/baking the filled insulation material. Further, a spin-on dielectric (SOD) layer having good gap-fill characteristics may be used for the insulation material. For example, the spin-on dielectric layer may be based on polysilazane.

The isolation layer 43 composed of the spin-on dielectric layer may be baked differently depending on a depth. That is to say, a lower zone 43B of the isolation layer 43 may be less baked than an upper zone 43A of the isolation layer 43.

By selectively etching the substrate 41, recess patterns 45 in which buried gates are to be formed may be defined. Hereafter, for the sake of convenience in explanation, the recess pattern 45 which is formed in the isolation layer 43 will be referred to as a first recess pattern 45A, and the recess pattern 45 which is formed in the active region 44 will be referred to as a second recess pattern 45B.

The first and second recess patterns 45A and 45B may have the same depth, and both the upper zone 43A and the lower zone 43B of the isolation layer 43 may be exposed due to forming of the first recess pattern 45A.

Referring to FIGS. 7B and 8, the surface of the first recess pattern 45A in the lower zone 43B of the isolation layer 43 may be baked by conducting an annealing process 301, and consequently a baked zone 43C may be formed. The baked zone 43C may function to reduce outgassing of impurities during a subsequent process for forming a gate dielectric layer by low pressure radical oxidation.

In the annealing process 301 for forming the baked zone 43C, the substrate 41 having the recess patterns 45 may be loaded into a chamber for the annealing process 301, and a temperature may be raised to a target oxidation temperature with a temperature raising speed of approximately 3° C./min to approximately 10° C./min in a nitrogen atmosphere under 1 atm (or the atmospheric pressure). If the temperature reaches the target oxidation temperature, the annealing process 301 may be conducted for approximately 5 to approximately 30 minutes in the same nitrogen atmosphere under the same 1 atm, and consequently the baked zone 43C may be formed. The target oxidation temperature may be in the range from approximately 750° C. to approximately 950° C.

The baked zone 43C may be formed by the thermal energy applied during the annealing process 301. The reason for forming the baked zone 43C under 1 atm is to reduce the occurrence of the outgassing of the impurities from the isolation layer 43. Since the reason why the temperature raising speed to the target oxidation temperature ranges from approximately 3° C./min to approximately ° C./min is described in detail in the previous exemplary embodiment of the present invention, detailed description thereof will be omitted herein.

Referring to FIGS. 7C and 8, in order to form a gate dielectric layer 46 having electrical characteristics and a thickness which are required by the semiconductor device, low pressure radical oxidation 302 may be conducted. Due to the characteristics of the low pressure radical oxidation 302, the gate dielectric layer 46 may not be formed on the surface of the first recess pattern 45A, but may be formed, for example, only on the surface of the second recess pattern 45B. Although the gate dielectric layer 46 may also be formed on the surface of the substrate 41 in the active region 44 by the low pressure radical oxidation 302, illustration thereof will be omitted herein for the sake of convenience in explanation.

In order to simplify the fabrication processes of the semiconductor device and improve the productivity, the low pressure radical oxidation 302 may be conducted in situ in the same chamber as in the annealing process 301.

In detail, in a state in which the baked zone 43C is formed in the isolation layer 43 through the annealing process 301, the gate dielectric layer 46 may be formed by conducting the low pressure radical oxidation 302. The low pressure radical oxidation 302 may be conducted under a low pressure that is lower than 1 atm (or the atmospheric pressure) at the same temperature range as in the annealing process 301, using a mixed gas in which the oxygen gas and the hydrogen gas are mixed. For example, the low pressure lower than 1 atm may have a range from approximately 0.1 torr to approximately 5.0 torr. The low pressure radical oxidation 302 may be conducted at a temperature ranging from approximately 750° C. to approximately 950° C.

Referring to FIG. 7D, gate electrodes 47 may be formed in such a way as to partially fill the recess patterns 45, and a sealing layer 48 may be formed to fill the remaining portions of the recess patterns 45, by which buried gates are formed.

In this exemplary embodiment of the present invention constructed as mentioned above, due to the fact that the baked zone 43C may be formed through the annealing process 301 in the lower zone 43B of the isolation layer 43 exposed due to the first recess pattern 45A, even when the gate dielectric layer 46 is formed through the low pressure radical oxidation 302, the occurrence of the outgassing of the impurities from the lower zone 43B of the isolation layer 43 during the process for forming the gate dielectric layer 46 may be reduced. Through this, the warpage of the substrate 41 may be reduced in the low pressure radical oxidation 302, and overlay characteristics may not be degraded in a photolithography process (see FIGS. 13A, 13B, and 14E).

[Experiment Result 1—Warpage of Substrate]

The effects of the exemplary embodiments of the present invention will be described below in detail with reference to FIGS. 9 to 13 which show the warpage of the conventional semiconductor device and the semiconductor devices according to the exemplary embodiments of the present invention. A bow value indicates the warpage of a substrate. The bow values indicating the warpage may be measured by scanning the substrate. For example, the substrate may be scanned in four directions, such as 0°, 45°, 90° and 135°, where 0° is any one direction. The warpage degree of the entire substrate may be represented by a numerical value as a range between the maximum value and the minimum value of the measured bow values.

Figure 9A:
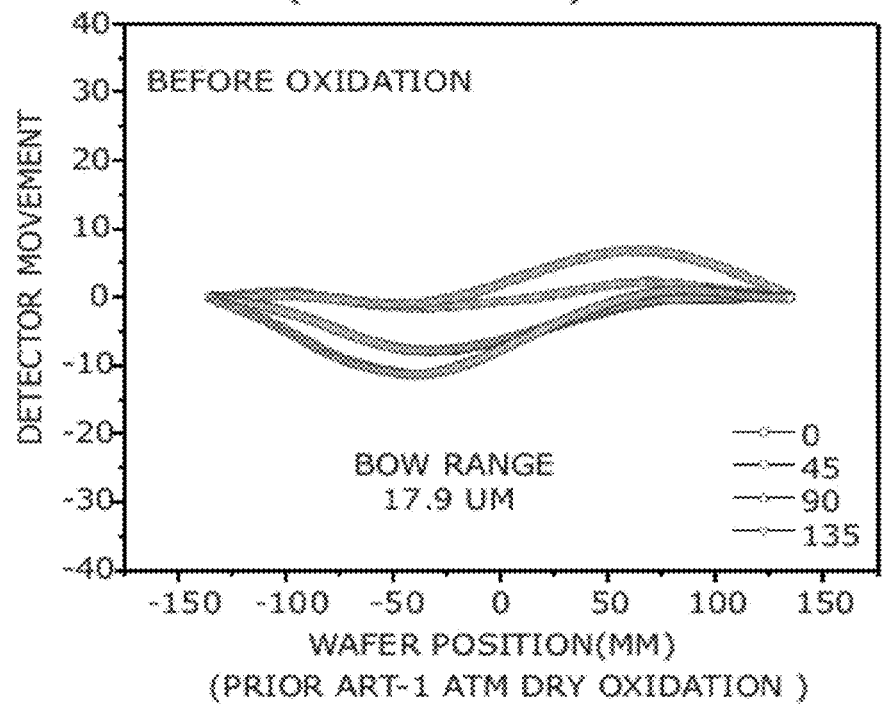
FIGS. 9A and 9B are graphs showing warpage of a substrate in the case where a gate dielectric layer is formed through 1 atm dry oxidation according to the conventional method.
Figure 9B:
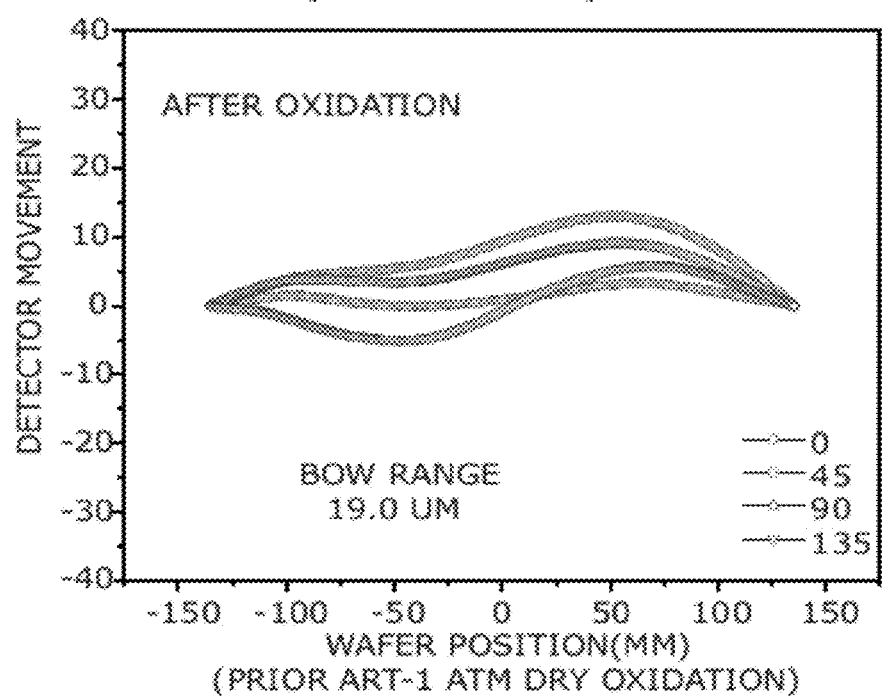
Figure 10A:
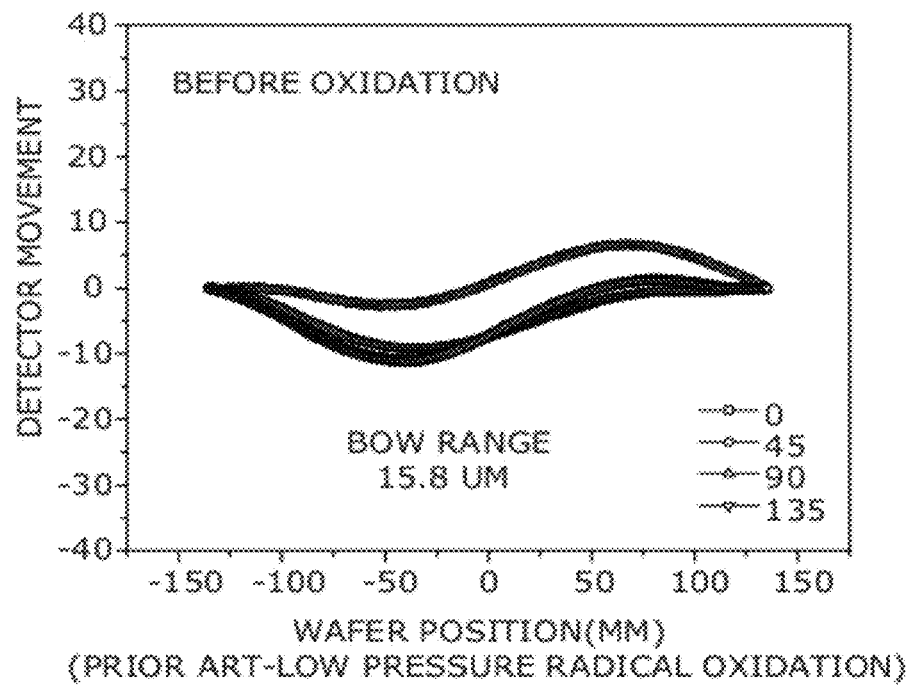
FIGS. 10A and 10B are graphs showing warpage of a substrate in the case where a gate dielectric layer is formed through low pressure radical oxidation according to the conventional method.
Figure 10B:
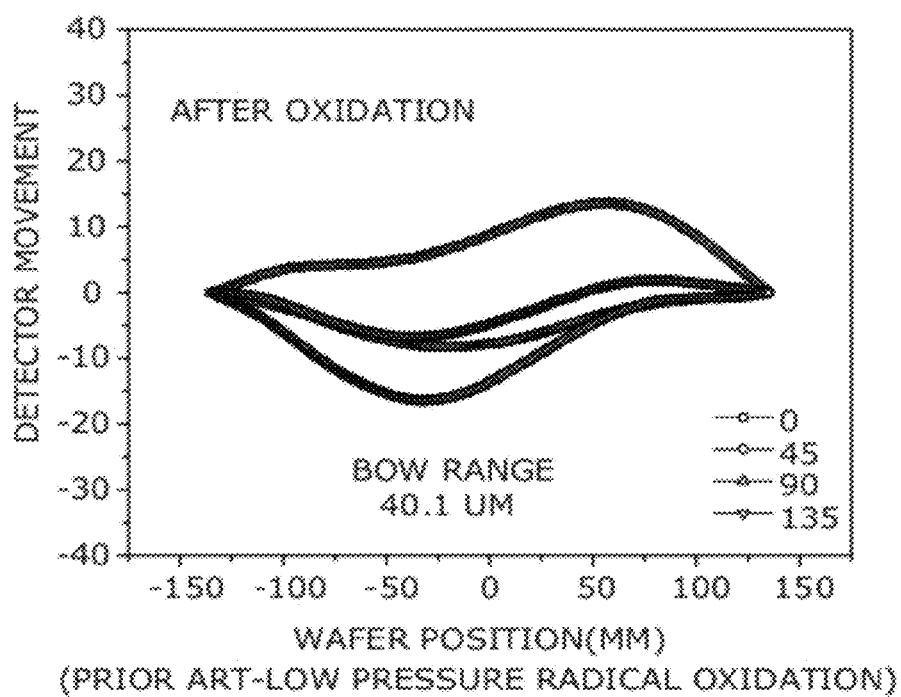
Figure 11A:
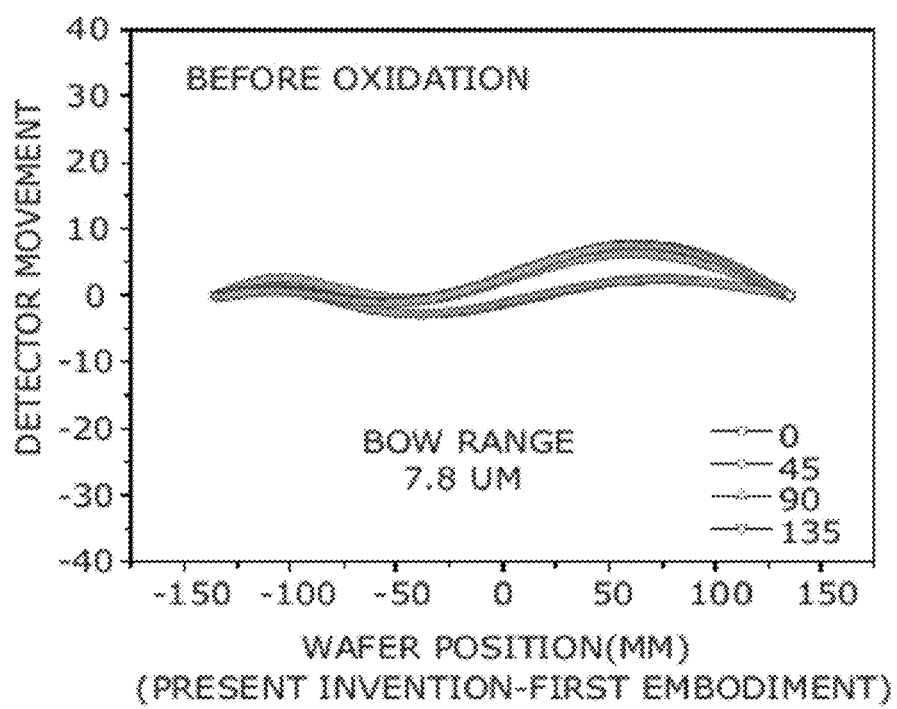
FIGS. 11A and 11B are graphs showing warpage of a substrate in the case where a gate dielectric layer is formed according to an exemplary embodiment of the present invention.
Figure 11B:
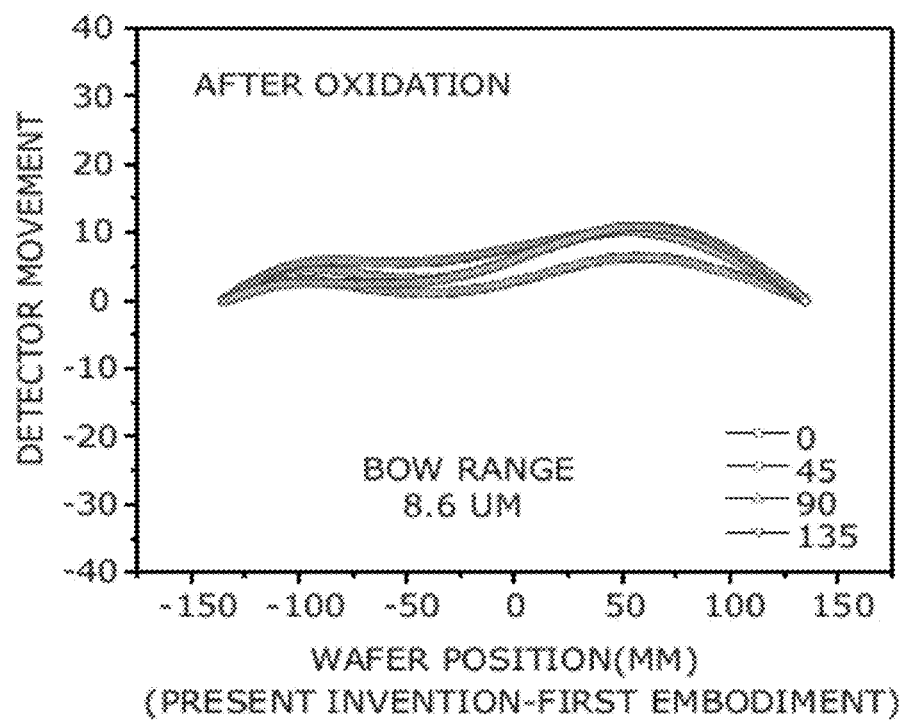

FIGS. 9A and 9B are graphs showing warpage of a substrate in the case where a gate dielectric layer is formed through 1 atm dry oxidation according to the conventional method, and FIGS. 10A and 10B are graphs showing warpage of a substrate in the case where a gate dielectric layer is formed through low pressure radical oxidation according to the conventional method. FIGS. 11A and 11B are graphs showing warpage of a substrate in the case where a gate dielectric layer is formed according to the exemplary embodiment of the present invention that is described above first, FIGS. 12A and 12B are graphs showing warpage of a substrate in the case where a gate dielectric layer is formed according to another exemplary embodiment of the present invention that is described above second, and FIGS. 13A and 13B are graphs showing warpage of a substrate in the case where a gate dielectric layer is formed according to yet another exemplary embodiment of the present invention that is described above third.

First, referring to FIGS. 9A and 9B, in the case where a gate dielectric layer is formed through 1 atm dry oxidation according to the conventional method, it was found that a bow range before forming the gate dielectric layer is 17.9 µm, and a bow range after forming the gate dielectric layer is 19.0 µm. Consequently, there is no substantial difference in bow range before and after forming the gate dielectric layer.

Conversely, referring to FIGS. 10A and 10B, in the case where a gate dielectric layer is formed through low pressure radical oxidation according to the conventional method, it was found that a bow range before forming the gate dielectric layer is 15.8 µm, but a bow range after forming the gate dielectric layer is 40.1 µm. Consequently, there is a substantial difference in bow range before and after forming the gate dielectric layer.

That is to say, in the case of the conventional method in which a baked zone is not formed on the surface of an isolation layer exposed due to a recess pattern, a substrate may be significantly warped when the gate dielectric layer is formed through low pressure radical oxidation, compared to when the gate dielectric layer is formed through 1 atm dry oxidation.

Therefore, forming the gate dielectric layer through low pressure radical oxidation allows the electrical characteristics of a gate dielectric layer to be secured in a highly integrated semiconductor device.

Referring to FIGS. 11A and 11B, by observing the case where a gate dielectric layer is formed through low pressure radical oxidation according to the exemplary embodiment of the present invention that is described above first, it was found that the bow range of a substrate before forming the gate dielectric layer is 12.3 µm, and the bow range of the substrate after forming the gate dielectric layer is 16.9 µm. Consequently, a difference in bow range before and after forming the gate dielectric layer is 4.6 µm. It may be understood that such a difference is a significantly low value when considering that a difference in bow range in the case of forming the gate dielectric layer through low pressure radical oxidation according to the conventional art is 24.3 µm.

Figure 12A:
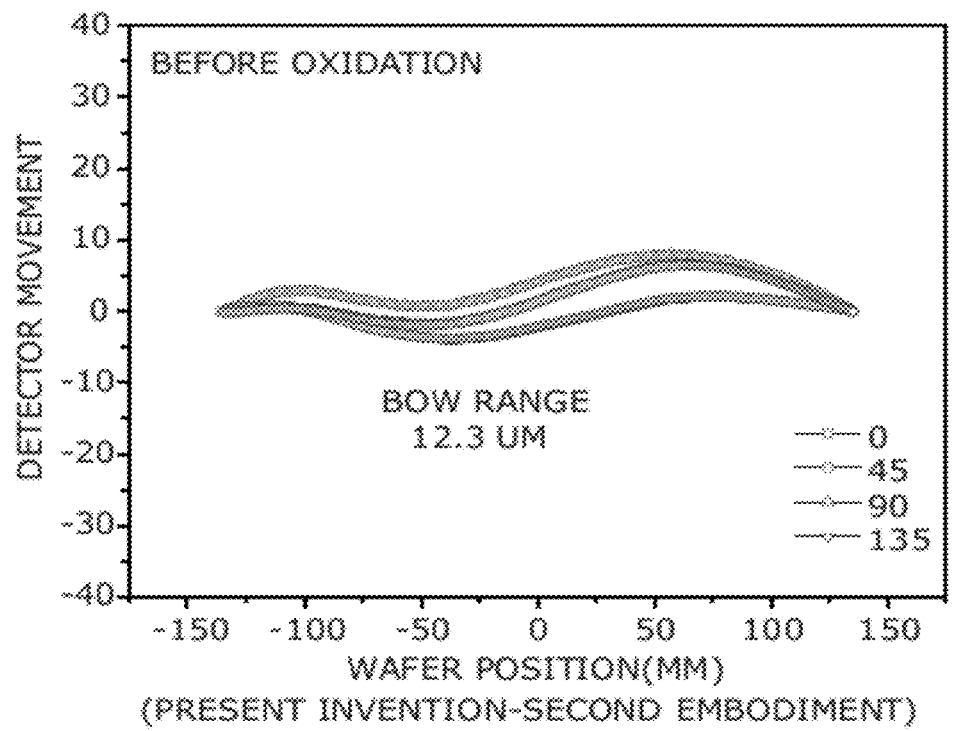
FIGS. 12A and 12B are graphs showing warpage of a substrate in the case where a gate dielectric layer is formed according to another exemplary embodiment of the present invention.
Figure 12B:
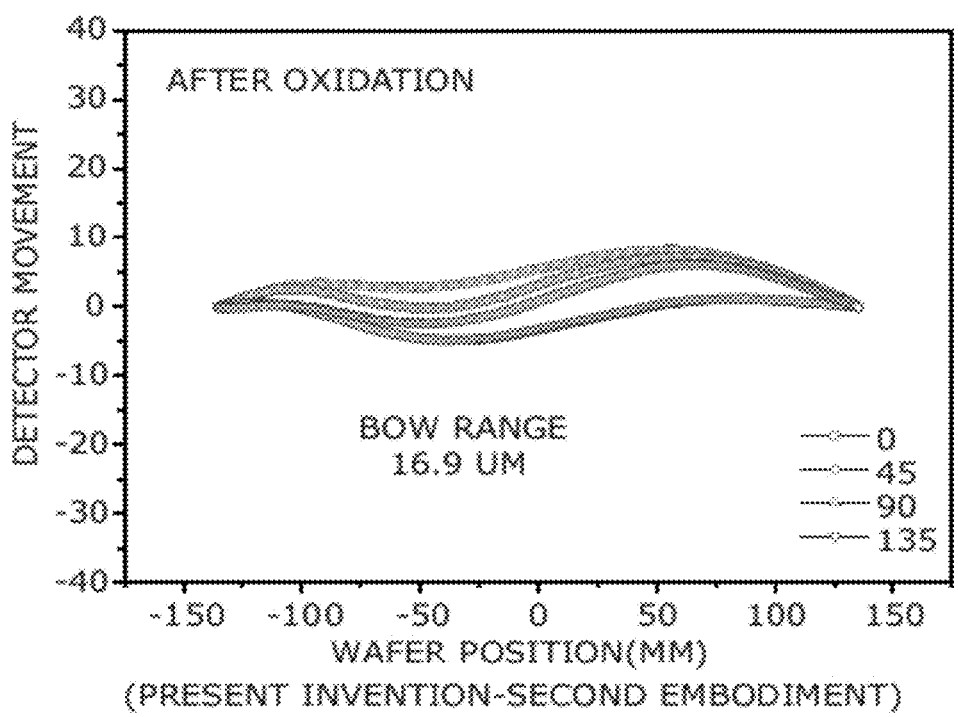

Referring to FIGS. 12A and 12B, by observing the case that a gate dielectric layer is formed through low pressure radical oxidation according to another exemplary embodiment of the present invention that is described above second, it was found that the bow range of a substrate before forming the gate dielectric layer is 10.4 µm, and the bow range of the substrate after forming the gate dielectric layer is 9.5 µm. Consequently, a difference in bow range before and after forming the gate dielectric layer is 0.9 µm. It may be understood that such a difference is a significantly low value when considering that a difference in bow range in the case of forming the gate dielectric Layer through low pressure radical oxidation according to the conventional art is 24.3 µm.

Figure 13A:
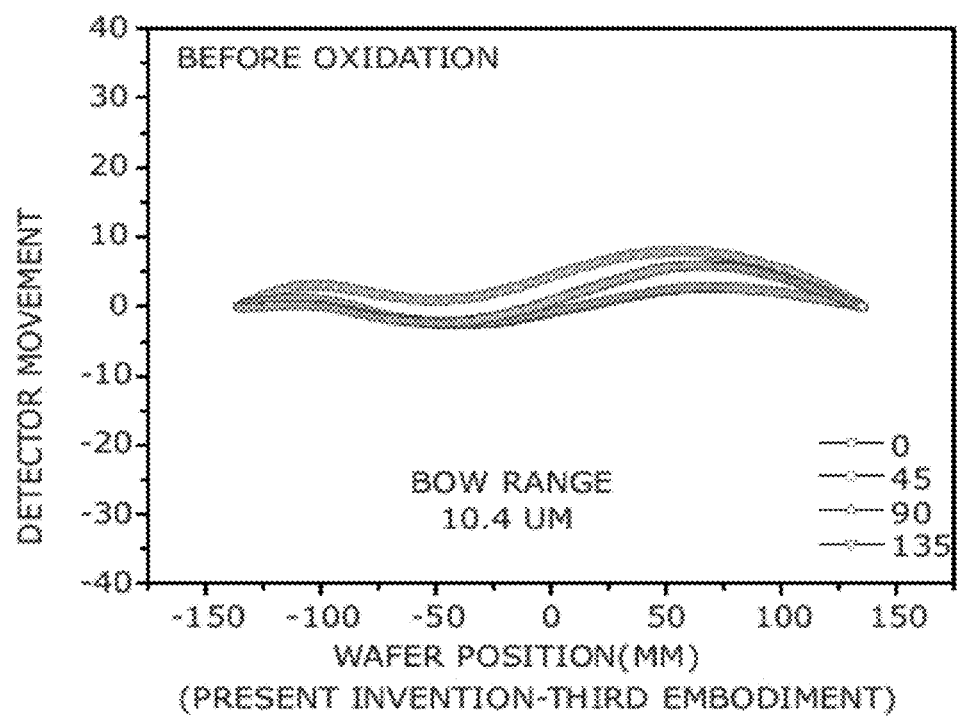
FIGS. 13A and 13B are graphs showing warpage of a substrate in the case where a gate dielectric layer is formed according to yet another exemplary embodiment of the present invention.
Figure 13B:
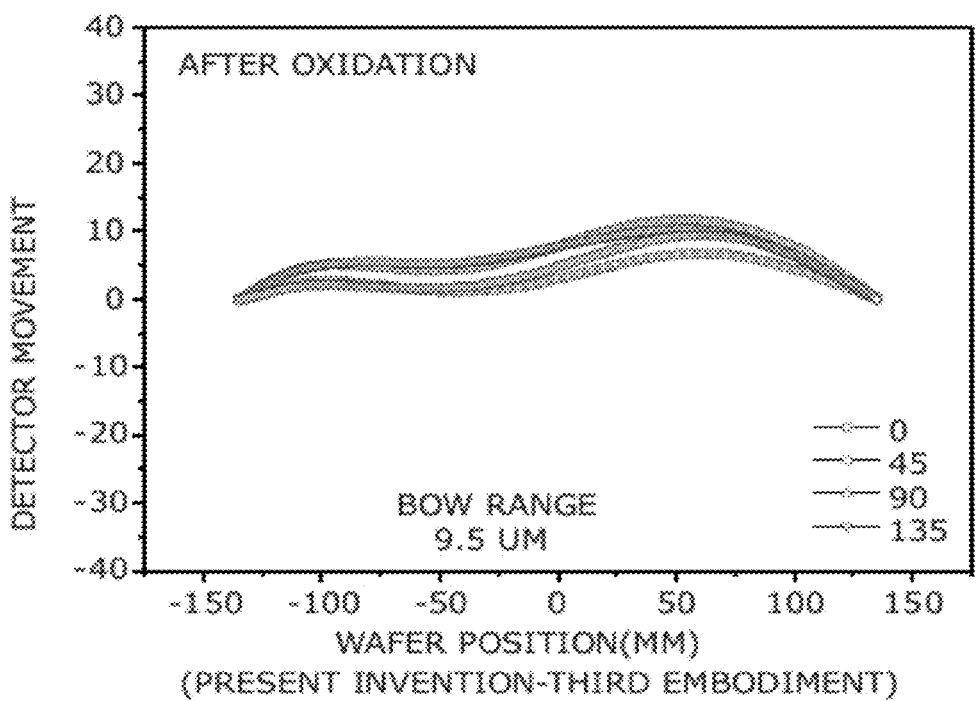

Referring to FIGS. 13A and 13B, by observing the case where a gate dielectric layer is formed through low pressure radical oxidation according to yet another exemplary embodiment of the present invention, it was found that the bow range of a substrate before forming the gate dielectric layer is 7.8 µm, and the bow range of the substrate after forming the gate dielectric layer is 8.6 µm. Consequently, a difference in bow range before and after forming the gate dielectric layer is 0.8 µm. It may be understood that such a difference is a significantly low value when considering that a difference in bow range in the case of forming the gate dielectric layer through low pressure radical oxidation according to the conventional art is 24.3 µm.

[Experiment Result 2—Overlay Characteristics]

The effects of the exemplary embodiments of the present invention will be described in detail with reference to FIGS. 14A to 14E which show the overlay characteristics of the conventional semiconductor device and the semiconductor devices according to the exemplary embodiments of the present invention. As the length and the area (or the size) of an arrow shown by an overlay vector map, which indicates an overlay degree with respect to a photolithography process, increases, it is meant that overlay performance is poor. As the length and the area of the arrow increases, an ROPI (residual overlay performance indicator) value increases. Thus, the lower the ROPI value, the better the overlay characteristics.

Figure 14A:
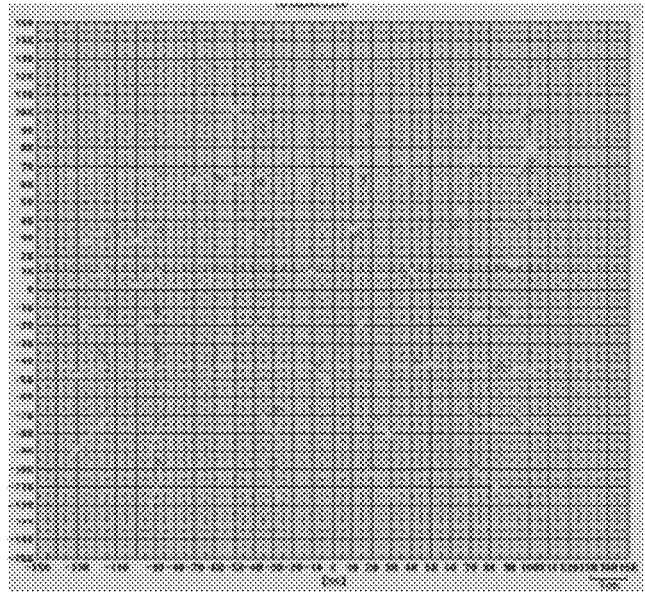
FIG. 14A is an overlay vector map showing a degree of overlay in a photolithography process in the case where a gate dielectric layer is formed through 1 atm dry oxidation according to the conventional method.
Figure 14B:
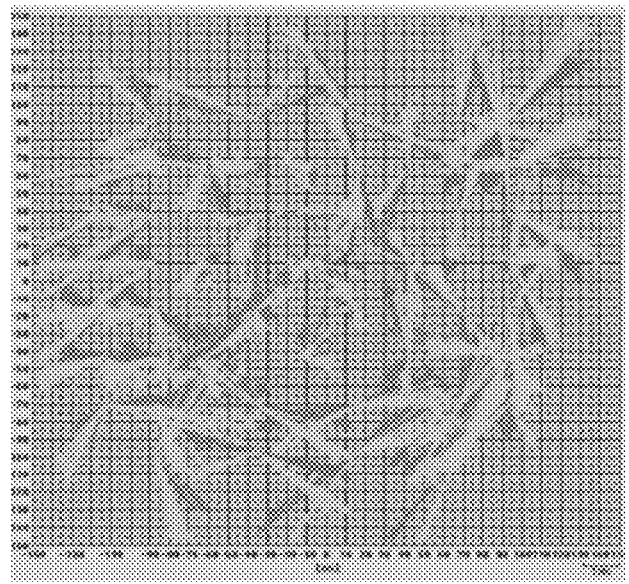
FIG. 14B is an overlay vector map showing a degree of overlay in a photolithography process in the case where a gate dielectric layer is formed through low pressure radical oxidation according to the conventional method.
Figure 14C:
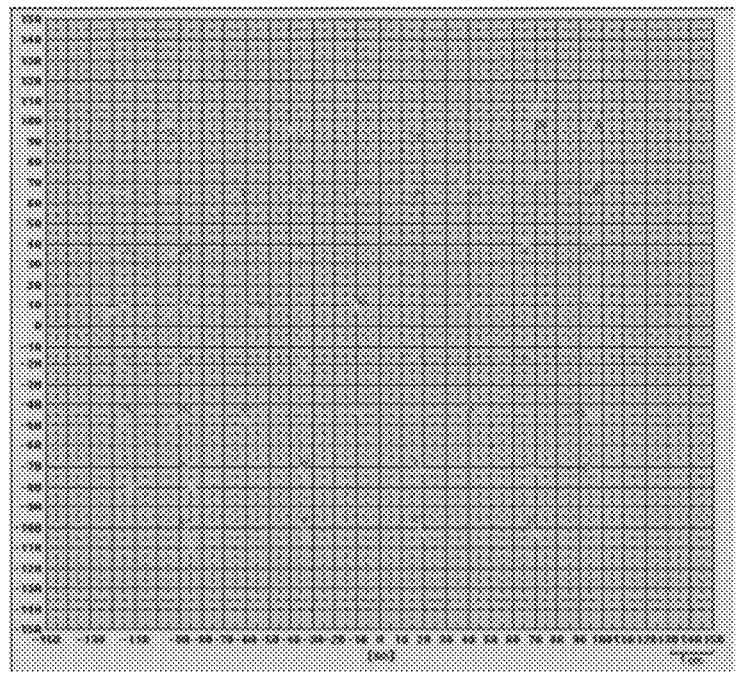
FIG. 14C is an overlay vector map showing a degree of overlay in a photolithography process in the case where a gate dielectric layer is formed according to an exemplary embodiment of the present invention.

FIGS. 14A to 14E are overlay vector maps which show the overlay characteristics of the conventional semiconductor device and the semiconductor devices according to the exemplary embodiments of the present invention. FIG. 14A is an overlay vector map showing a degree of overlay in a photolithography process in the case where a gate dielectric layer is formed through 1 atm dry oxidation according to the conventional method, and FIG. 14B is an overlay vector map showing a degree of overlay in a photolithography process in the case where a gate dielectric layer is formed through low pressure radical oxidation according to the conventional method. FIG. 14C is an overlay vector map showing a degree of overlay in a photolithography process in the case where a gate dielectric layer is formed according to the exemplary embodiment of the present invention that is described above first, FIG. 14D is an overlay vector map showing a degree of overlay in a photolithography process in the case where a gate dielectric layer is formed according to another exemplary embodiment of the present invention that is described above second, and FIG. 14E is an overlay vector map showing a degree of overlay in a photolithography process in the case where a gate dielectric layer is formed according to yet another exemplary embodiment of the present invention.

First, referring to FIGS. 14A and 14B, in the case where a gate dielectric layer is grown through 1 atm dry oxidation as in the conventional art, it was found that an ROPI value may be as low as 9 nm. However, in the case where a gate dielectric layer is grown through low pressure radical oxidation as in the conventional art, it was found that an ROPI value increases to 36 nm so that overlay characteristics are degraded.

Referring to FIG. 14C, in the case where a gate dielectric layer is formed through low pressure radical oxidation according to the exemplary embodiment of the present invention that is described above first, it was found that an ROPI value may be as low as 13 nm. It may be understood that such an ROPI value is a significantly low value when considering that an ROPI value in the case of forming the gate dielectric layer through low pressure radical oxidation according to the conventional art is 36 nm.

Figure 14D:
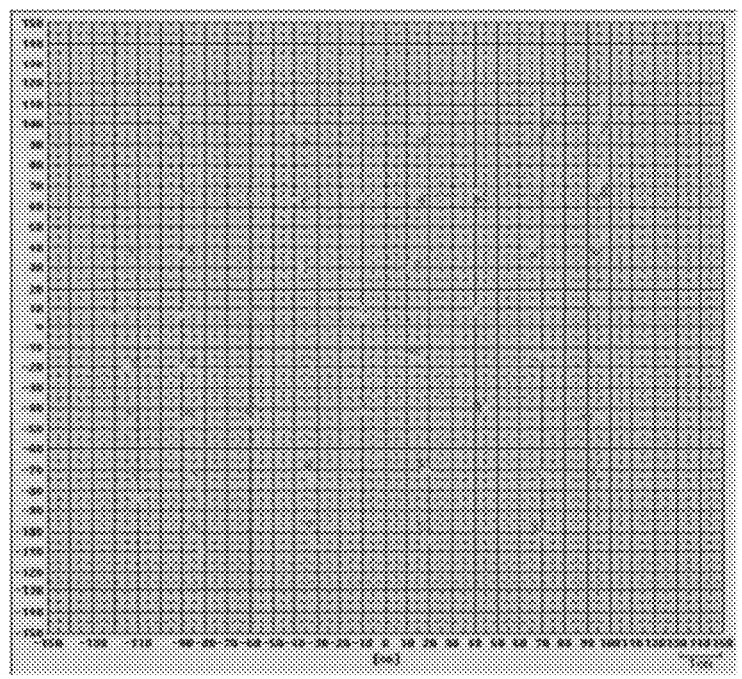
FIG. 14D is an overlay vector map showing a degree of overlay in a photolithography process in the case where a gate dielectric layer is formed according to another exemplary embodiment of the present invention.

Referring to FIG. 14D, in the case where a gate dielectric layer is formed through low pressure radical oxidation according to another exemplary embodiment of the present invention that is described above second, it was found that an ROPI value is so low to 11 nm. It may be understood that such an ROPI value is a significantly low value when considering that an ROPI value in the conventional art is 36 nm.

Figure 14E:
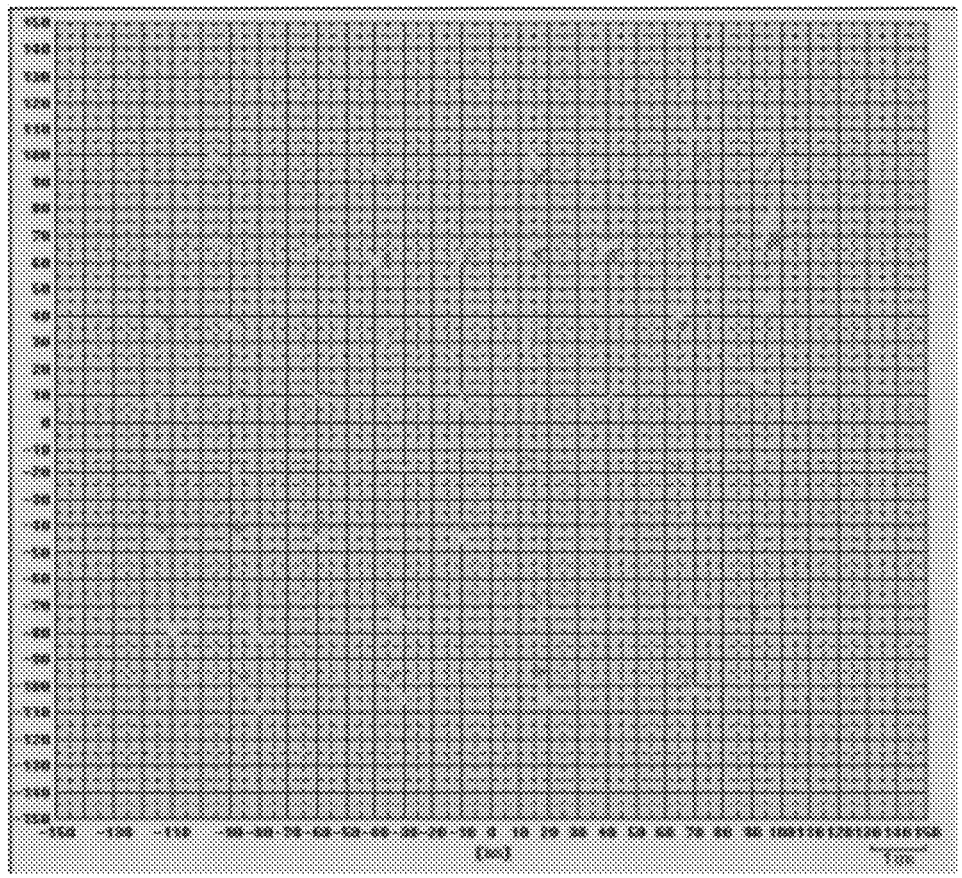
FIG. 14E is an overlay vector map showing a degree of overlay in a photolithography process in the case where a gate dielectric layer is formed according to yet another exemplary embodiment of the present invention.

Referring to FIG. 14E, in the case where a gate dielectric layer is formed through low pressure radical oxidation according to yet another exemplary embodiment of the present invention, it was found that an ROPI value may be as low as 9 nm. It may be understood that such an ROPI value is a significantly low value when considering that an ROPI value in the conventional art is 36 nm.

As is apparent from the above description, in the exemplary embodiments of the present invention, since the surface of an isolation layer, which is exposed due to the formation of recess patterns, may be baked through an annealing process (or a first oxidation process), it is possible to reduce outgassing of impurities from the isolation layer even though a gate dielectric layer is formed through low pressure radical oxidation.

Through this, in the exemplary embodiments of the present invention, the warpage of a substrate may be reduced. As a consequence, overlay characteristics may not be degraded in a photolithography process.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming an isolation layer that defines an active region in a substrate;
   forming recess patterns in the active region and the isolation layer;
   baking a surface of the recess patterns by conducting an annealing process at a target annealing temperature within a first temperature range in order to prevent outgassing of impurities contained in the isolation layer; and
   forming a gate dielectric layer over a surface of the recess patterns by conducting an oxidation process at a target oxidation temperature within a second temperature range that is substantially the same as the first temperature range,
   wherein the oxidation process is conducted under a pressure lower than in the annealing process.

2. The method of claim 1, further comprising:
   forming gate electrodes over the gate dielectric layer to partially fill the recess patterns; and
   forming a sealing layer to fill remaining portions of the recess patterns.

3. The method of claim 1, wherein the isolation layer comprises a spin-on dielectric layer.

4. The method of claim 3, wherein the forming of the isolation layer comprises:
   forming a trench by selectively etching the substrate;
   applying the spin-on dielectric layer to fill the trench; and
   baking the spin-on dielectric layer by conducting an annealing process.

5. The method of claim 1, wherein the annealing process is conducted under 1 atm or an atmospheric pressure.

6. The method of claim 1, wherein the oxidation process is conducted under a pressure ranging from 0.1 torr to 5.0 torr.

7. The method of claim 1, wherein, in the oxidation process and the annealing process, a temperature is raised to a target temperature with a speed of 3° C/min to 10° C/min.

8. The method of claim 1, wherein the oxidation process and the annealing process are each conducted at the respective target temperature ranging from 750° C. to 950° C.

9. The method of claim 1, wherein the oxidation process is conducted through radical oxidation under a low pressure that is lower than 1atm or an atmospheric pressure.

10. The method of claim 1, wherein the oxidation process and the annealing process are conducted in situ in the same chamber.

11. A method for fabricating a semiconductor device, comprising:
   forming an isolation layer that defines an active region in a substrate;
   forming recess patterns in the active region and the isolation layer;
   performing a first oxidation process at a first target temperature within a first temperature range to bake a surface of the recess patterns and to form a first dielectric layer over a surface of the recess patterns in the active region in order to prevent outgassing of impurities contained in the isolation layer; and
   performing a second oxidation process at a second target temperature within a second temperature range to form a second dielectric layer over the first dielectric layer,
   wherein the second temperature ranee is substantially the same as the first temperature ranee and the second oxidation process is conducted under a pressure lower than in the first oxidation process.

12. The method of claim 11, further comprising:
   forming gate electrodes over the second dielectric layer to partially fill the recess patterns; and
   forming a sealing layer to fill remaining portions of the recess patterns.

13. The method of claim 11, wherein the isolation layer comprises a spin-on dielectric layer.

14. The method of claim 13, wherein the forming of the isolation layer comprises:
   forming a trench by selectively etching the substrate;
   applying the spin-on dielectric layer to fill the trench; and
   baking the spin-on dielectric layer by conducting an annealing process.

15. The method of claim 11, wherein the first oxidation process is conducted under 1 atm or an atmospheric pressure.

16. The method of claim 11, wherein the second oxidation process is conducted under a pressure ranging from 0.1 torr to 5.0 torr.

17. The method of claim 11, wherein the first oxidation process is conducted through dry oxidation.

18. The method of claim 11, wherein the second oxidation process is conducted through radical oxidation.

19. The method of claim 11, wherein, while the first oxidation process and the second oxidation process are performed, a temperature is raised to a target temperature with a speed of 3° C/min to 10° C/min.

20. The method of claim 11, wherein the first oxidation process and the second oxidation process are each conducted at the respective target temperature ranging from 750° C. to 950° C.

21. The method of claim 11, wherein the first dielectric layer is formed to have a thickness ranging from 10% to 20% of an entire thickness of the gate dielectric layer.

22. The method of claim 11, wherein the first oxidation process and the second oxidation process are conducted in situ in the same chamber.

\* \* \* \* \*